(12) United States Patent
Pullela et al.

(10) Patent No.: US 7,219,195 B2
(45) Date of Patent: May 15, 2007

(54) ASSOCIATIVE MEMORY WITH INVERT RESULT CAPABILITY

(75) Inventors: Venkateshwar Rao Pullela, San Jose, CA (US); Shyamasundar S. Kaluve, Bangalore (IN)

(73) Assignee: Cisco Technology, Inc., San Jose, CA (US)

(*) Notice: Subject to any disclaimer, the term of this patent is extended or adjusted under 35 U.S.C. 154(b) by 336 days.

(21) Appl. No.: 11/018,993

(22) Filed: Dec. 21, 2004

(65) Prior Publication Data
US 2006/0136660 A1   Jun. 22, 2006

(51) Int. Cl.
*G06F 13/00*   (2006.01)
(52) U.S. Cl. ........................ 711/128; 711/108
(58) Field of Classification Search ............... None
See application file for complete search history.

(56) References Cited

U.S. PATENT DOCUMENTS

| | | | |
|---|---|---|---|
| 5,440,715 A * | 8/1995 | Wyland .................. | 711/108 |
| 5,946,704 A * | 8/1999 | Yoneda et al. ............ | 711/108 |
| 6,166,938 A * | 12/2000 | Wong ..................... | 365/49 |
| 6,295,576 B1 * | 9/2001 | Ogura et al. ............ | 711/108 |
| 6,374,326 B1 | 4/2002 | Kansal et al. | |
| 6,377,577 B1 | 4/2002 | Bechtolsheim et al. | |
| 6,389,506 B1 | 5/2002 | Ross et al. | |
| 6,424,560 B2 * | 7/2002 | Nishii et al. ............ | 365/154 |
| 6,467,019 B1 | 10/2002 | Washburn | |
| 6,526,474 B1 | 2/2003 | Ross | |
| 6,535,951 B1 | 3/2003 | Ross | |
| 6,606,681 B1 | 8/2003 | Uzun | |
| 6,643,260 B1 | 11/2003 | Kloth et al. | |
| 6,647,457 B1 * | 11/2003 | Sywyk et al. ............ | 711/108 |
| 6,651,096 B1 | 11/2003 | Gai et al. | |
| 6,658,002 B1 | 12/2003 | Ross et al. | |
| 6,658,458 B1 | 12/2003 | Gai et al. | |
| 6,687,144 B2 | 2/2004 | Batson et al. | |
| 6,715,029 B1 | 3/2004 | Trainin et al. | |
| 6,717,946 B1 | 4/2004 | Hariguchi et al. | |
| 6,725,326 B1 | 4/2004 | Patra et al. | |
| 6,738,862 B1 | 5/2004 | Ross et al. | |
| 6,757,779 B1 * | 6/2004 | Nataraj et al. .......... | 711/108 |
| 6,775,737 B1 | 8/2004 | Warkhede et al. | |
| 6,862,281 B1 | 3/2005 | Chandrasekaran | |

(Continued)

*Primary Examiner*—Matthew Kim
*Assistant Examiner*—Christopher D Birkhimer
(74) *Attorney, Agent, or Firm*—The Law Office of Kirk D. Williams

(57) ABSTRACT

An associative memory with an invert result capability to allow the identification of an entry as being matched when an entry or portion thereof is specifically not matched is disclosed (or alternatively viewed as an entry or portion thereof indicated as matched when it actually was not matched). One such associative memory typically includes multiple associative memory entries, each of which typically includes storage for one or more subsets of bits to be used in matching a lookup value and for one or more invert result indications to identify whether or not corresponding particular subsets of the one or more subsets of bits are to be inverted in producing an entry match result. Result generation logic is used to identifying the entry match result based on a comparison of the one or more subsets of bits with the lookup value and responsive to the one or more invert result indications to invert an intermediate comparison result for the one or more subsets of bits as indicated by the one or more invert result indications.

19 Claims, 8 Drawing Sheets

U.S. PATENT DOCUMENTS

| | | |
|---|---|---|
| 6,871,262 B1 | 3/2005 | Oren et al. |
| 6,871,265 B1 | 3/2005 | Oren et al. |
| 6,944,709 B2 * | 9/2005 | Nataraj et al. .............. 711/108 |
| 6,961,808 B1 | 11/2005 | Oren et al. |
| 6,970,971 B1 | 11/2005 | Warkhede et al. |
| 2002/0129198 A1 * | 9/2002 | Nataraj et al. .............. 711/108 |
| 2002/0161969 A1 * | 10/2002 | Nataraj et al. .............. 711/108 |
| 2003/0156440 A1 * | 8/2003 | Hata et al. .................... 365/49 |
| 2003/0231631 A1 | 12/2003 | Pullela |
| 2004/0030802 A1 | 2/2004 | Eatherton et al. |
| 2004/0030803 A1 | 2/2004 | Eatherton et al. |
| 2004/0100950 A1 | 5/2004 | Basu et al. |
| 2004/0139275 A1 * | 7/2004 | McKenzie et al. .......... 711/108 |
| 2004/0170171 A1 | 9/2004 | Kanekar et al. |
| 2004/0170172 A1 | 9/2004 | Pullela et al. |
| 2004/0172346 A1 | 9/2004 | Kanekar et al. |
| 2005/0010612 A1 | 1/2005 | Enderwick et al. |
| 2005/0114602 A1 | 5/2005 | Ngai et al. |
| 2005/0157712 A1 | 7/2005 | Rangaranjan et al. |
| 2006/0184773 A1 * | 8/2006 | Curran et al. ............... 712/221 |

\* cited by examiner

US 7,219,195 B2

ASSOCIATIVE MEMORY WITH INVERT RESULT CAPABILITY

TECHNICAL FIELD

One embodiment of the invention relates to communications and computer systems, especially networked routers, packet switching systems, and other devices which employ associative memories, such as, but not limited to, implementing access control lists; and more particularly, one embodiment relates to an associative memory with an invert result capability to allow the identification of an entry as being matched when an entry or portion thereof is specifically not matched (or alternatively viewed as an entry or portion thereof indicated as not matched when it actually was matched).

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs typically require matching packets on a subset of fields of the packet header or flow label, with the semantics of a sequential search through the ACL rules. Access control and quality of service features are typically implemented based on programming contained in one or more ACLs. To implement features in hardware, one or more ACL lists are converted to associative memory entries which are programmed into an associative memory for performing matching operations to identify a desired result (e.g., drop, route, etc.) for a packet.

Associative memories are often used in a communications device for implementing the policies specified in ACLs. FIG. 1A shows one prior art associative memory 100 having multiple associative memory entries 102. Programming and lookup signals 101 are used to program associative memory entries 102, as well as to provide a lookup value for comparing to the associative memory entries 102 to generate entries' match results 119. Typically but not always, a priority encoder 120 is included in or with an associative memory to identify a highest priority result 121 from entries' match results 119 which indicate a match was found for a given lookup value. In one embodiment associative memory entries may include binary content-addressable memory entries (e.g., include a value to be compared against), ternary content-addressable memory entries (e.g., include a value and mask used to identify a value to be compared against), or another type of associative memory entries.

FIG. 1B illustrates another prior art associative memory 110 which includes multiple search blocks 112, 114 and 116, each of which typically include a block mask capability to be used to mask each entry (e.g., binary or ternary content-addressable memory entry) within its corresponding block in identifying a value to be compared against the provided lookup value.

FIG. 1C illustrates a typical prior art associative memory entry with comparison logic 140. A value to be compared 142, which typically includes a stored comparison value and possibly a mask (such as in a ternary content-addressable memory) and possibly this result is masked with a block mask. A comparison is made between the lookup value 145 and the value to be compared 142 to identify an entry match result 147 identifying whether there was a match (i.e., a hit) or there was not a match (e.g., a miss). FIG. 1D illustrates part of a typical prior art associative memory entry cell 160. The results of the bit-by-bit comparisons 161–169 are generated based on the lookup value and the value to be compared. A result line 171 is typically used to perform a wired-AND operation. If any one of the bit-by-bit comparison results 161–169 results in a miss (e.g., a low value), the corresponding bit match transistor 174 is turned on and the result line 171 becomes high due to Vcc 180, which produces a miss indication on result signal 185 (which in one embodiment is inverted by inverter 182 to drive the hit/miss indication signal 185); otherwise, a hit indication is produced on result signal 185.

It is common for an ACL entry to specify an address to match, which can usually be converted to a single associative memory entry. However, it is also common to specify every address but a single (or even multiple) addresses in an ACL entry, which causes many associative memory address to be generated. For example, if a ternary content-addressable memory is being used, all entries but a single value typically can be specified in thirty-two entries. This explosion of entries problem can be further compounded when multiple ACL lists are combined into a single set of associative memory entries using one of several well-known techniques. In a product with a limited number of associative memory entries available, a few ACL entries can consume a significant portion or all of the associative memory entries.

SUMMARY

Disclosed are, inter alia, methods, apparatus, data structures, computer-readable media, and mechanisms, which may include or be used with an associative memory with an invert result capability to allow the identification of an entry as being matched when an entry or portion thereof is specifically not matched. (An alternative way of viewing this is that an entry or portion thereof is indicated as not matched when it actually was matched.) One embodiment includes multiple associative memory entries. Each of these associative memory entries typically includes storage for one or more subsets of bits to be used in matching a lookup value and for one or more invert result indications to identify whether or not corresponding particular subsets of the one or more subsets of bits are to be inverted in producing an entry match result. Result generation logic is used to identifying the entry match result based on a comparison of the one or more subsets of bits with the lookup value and responsive to the one or more invert result indications to invert an intermediate comparison result for the one or more subsets of bits as indicated by the one or more invert result indications.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Figure 1A:
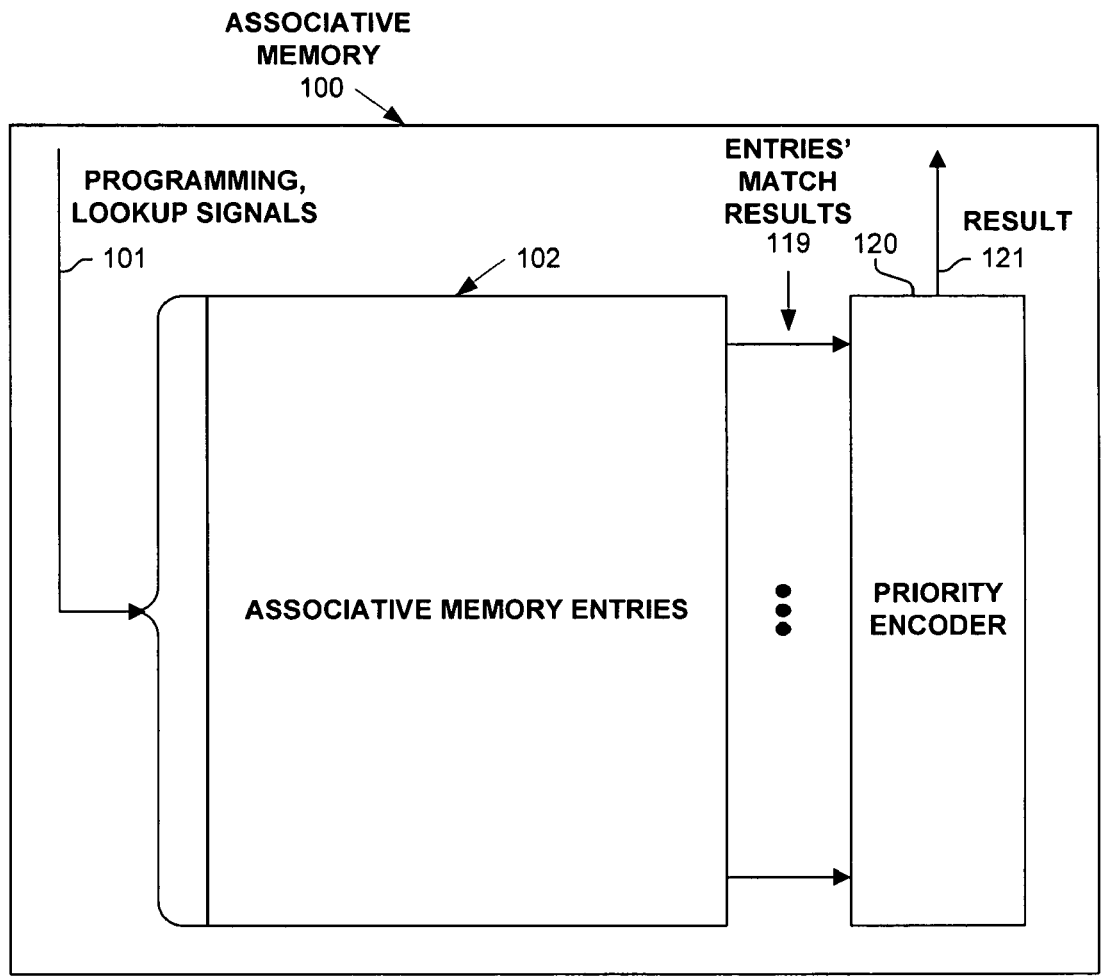
FIGS. 1A–D are block diagrams illustrating some prior art associative memories or portions thereof.
Figure 1B:
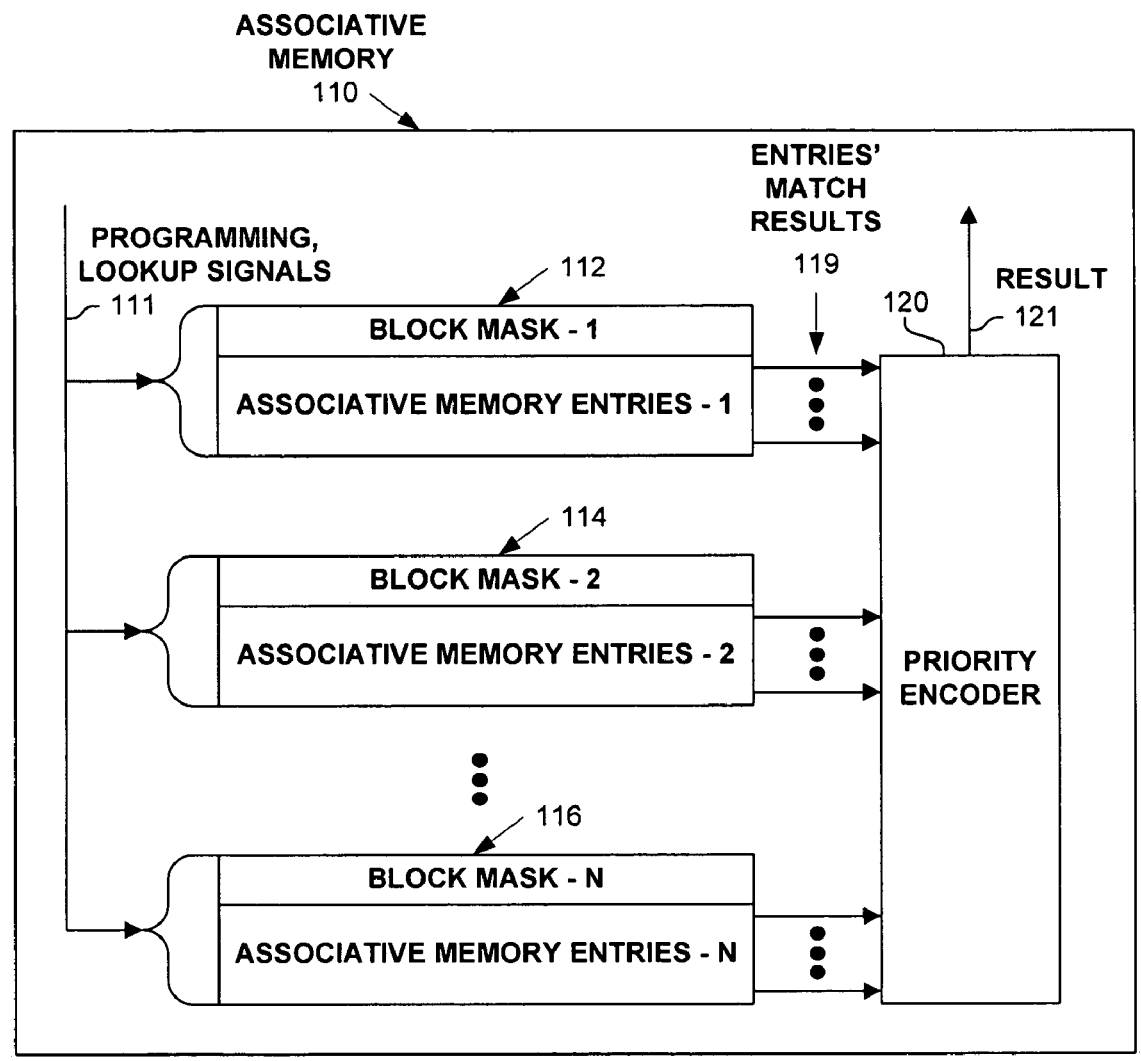
Figure 1C:
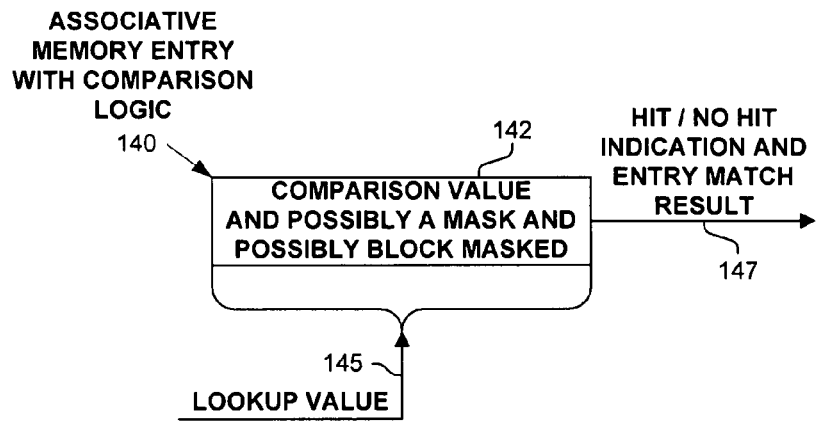
Figure 1D:
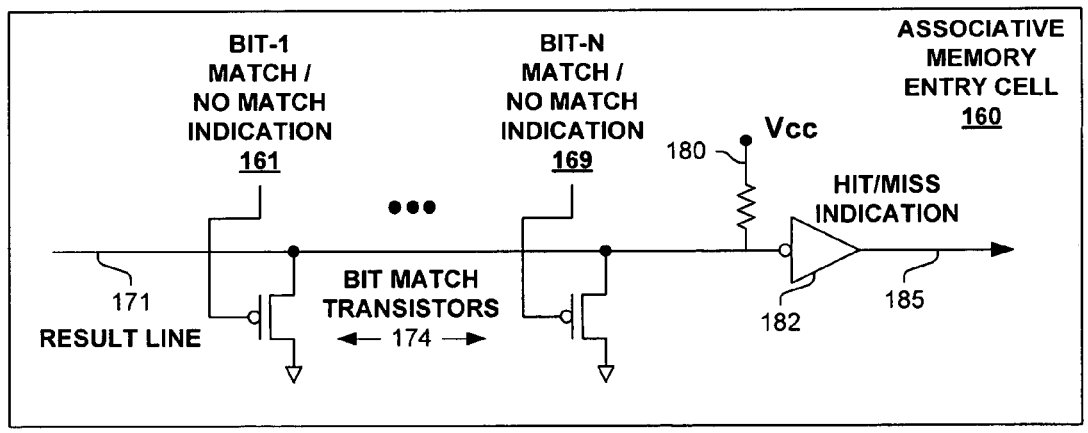

Disclosed are, inter alia, methods, apparatus, data structures, computer-readable media, and mechanisms, which may include or be used with an associative memory with an invert result capability to allow the identification of an entry as being matched when an entry or portion thereof is specifically not matched.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to, all or part of a packet or packet header, a data structure value, pointer or index, or any other part or direct or indirect identification of a packet or information associated therewith. For example, often times a router operates on one or more fields of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value—the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage and signaling mechanisms including interfaces and devices such as network interface cards and buffers therein, as well as any communications devices and signals received and transmitted, and other current and evolving technologies that a computerized system can interpret, receive, and/or transmit. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc. The term "associative memory" is an extensible term, and refers to all types of known or future developed associative memories, including, but not limited to binary and ternary content addressable memories, hash tables, TRIE and other data structures, etc. Additionally, the term "associative memory unit" may include, but is not limited to one or more associative memory devices or parts thereof, including, but not limited to regions, segments, banks, pages, blocks, sets of entries, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium or media containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory," etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps.

Disclosed are, inter alia, methods, apparatus, data structures, computer-readable media, and mechanisms, which may include or be used with an associative memory with an invert result capability to allow the identification of an entry as being matched when an entry or portion thereof is specifically not matched. An alternative way of viewing this is that an entry or portion thereof is indicated as not matched when it actually was matched.

One embodiment includes multiple associative memory entries. Each of these associative memory entries typically includes storage for one or more subsets of bits to be used in matching a lookup value and for one or more invert result indications to identify whether or not corresponding particular subsets of the one or more subsets of bits are to be inverted in producing an entry match result. Result generation logic is used to identifying the entry match result based on a comparison of the one or more subsets of bits with the lookup value and responsive to the one or more invert result indications to invert an intermediate comparison result for the one or more subsets of bits as indicated by the one or more invert result indications.

In one embodiment, the one or more subsets of bits includes exactly one subset of bits. In one embodiment, the one subset of bits and the lookup value each include the same number of bits being compared against each other. One embodiment includes a priority encoder to identify a highest priority matching entry from the entry match results of the plurality of associative memory entries for a particular lookup value. In one embodiment, the one or more subsets of bits includes at least two subsets of bits.

One embodiment maintains one or more associative memory entries, each of which includes one or more subsets of bits to be used in matching lookup values and for one or more invert result indications to identify whether or not corresponding particular subsets of the one or more subsets of bits are to be inverted in producing an entry match result. An entry match result is generated for each associative memory entry of the one or more associative memory entries for a particular lookup value based on a comparison of the entry's one or more subsets of bits with the particular lookup value and an inversion of intermediate comparison results of the comparison for the one or more subsets of bits if indicated by the entry's one or more invert result indications. In one embodiment, the one or more subsets of bits includes exactly one subset of bits. In one embodiment, the one subset of bits and the particular lookup value each include the same number of bits being compared against each other. In one embodiment, the one or more associative memory entries includes at least two associative memory entries. One embodiment identifies a highest priority matching entry from the entry match results of the one or more associative memory entries for the particular lookup value. In one embodiment, the one or more subsets of bits includes at least two subsets of bits. One embodiment identifies the values of the one or more invert result indications based on a specification of an access control list; and programs the one or more invert result indications with the identified values.

One embodiment includes means for maintaining one or more associative memory entries, each of the one or more associative memory entries including one or more subsets of bits to be used in matching lookup values and for one or more invert result indications to identify whether or not corresponding particular subsets of the one or more subsets of bits are to be inverted in producing an entry match result. Also included is means for generating an entry match result for each associative memory entry of the one or more associative memory entries results for a particular lookup value based on a comparison of the entry's one or more subsets of bits with the particular lookup value and an inversion of intermediate comparison results of the comparison for the one or more subsets of bits if indicated by the entry's one or more invert result indications.

In one embodiment, the one or more subsets of bits includes exactly one subset of bits. In one embodiment, the one subset of bits and the particular lookup value each include the same number of bits being compared against each other. In one embodiment, the one or more associative memory entries includes at least two associative memory entries. One embodiment includes means for identifying a highest priority matching entry from the entry match results of the one or more associative memory entries for the particular lookup value. In one embodiment, the one or more subsets of bits includes at least two subsets of bits. One embodiment includes means for identifying the values of the one or more invert result indications based on a specification of an access control list; and means for programming the one or more invert result indications with the identified values.

Figure 2:
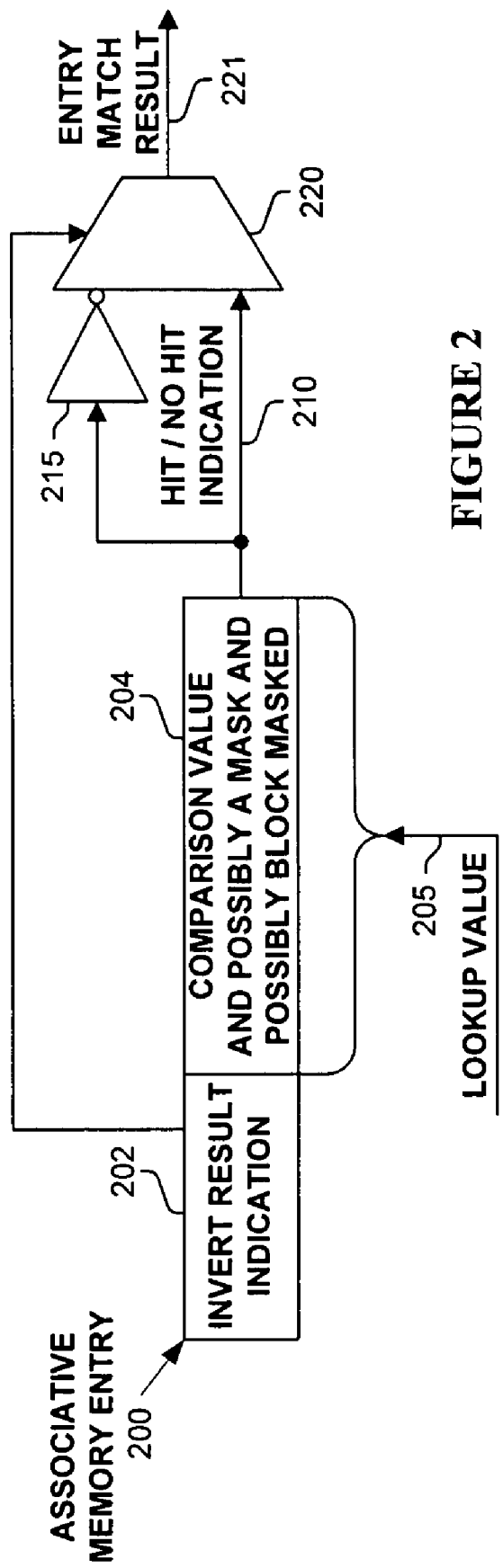
FIG. 2 is a block diagram of an associative memory entry with an invert result capability to allow the identification the entry as being matched when the entry is specifically not matched.

FIG. 2 is a block diagram of an associative memory entry 200 with an invert result capability to allow the identification the entry as being matched when the entry is specifically not matched (or alternatively viewed as an entry is indicated as not matched when it actually was matched). Shown is one embodiment that includes the traditional associative memory functionality including storing and/or generating a comparison value 204 (which is possibly masked and/or block masked) which is compared against a lookup value 205 to generate a hit/no-hit (intermediate) indication 210 for associative memory entry 200. The mechanism or method used to store and generate a comparison value 204 and to compare it against lookup value 205 to generate result 210 is extensible, and can be any known or future developed associative memory mechanism. Rather, one embodiment of the invention enhances this traditional capability by adding a mechanism to selectively invert result 210 responsive to a stored invert result indication 202 (e.g., one or more bits, a value, etc.) to produce entry match result 221. Typically and in one embodiment, the invert result indication is stored in its corresponding associative entry. In one embodiment, the invert result indication is stored elsewhere in or external to the associative memory. One embodiment uses a selection mechanism 220 which is responsive to invert result indication 202 to select between the generated hit/no hit indication 210 or its inverted value (generated such as by an inverter 215) to produce the entry match result 221 indicating whether associative memory entry 200 is considered as a hit or a no-hit, with this signal typically being provided to a priority encoder or used directly by another mechanism or process. Of course, FIG. 2 illustrates the operation of one embodiment, and an unlimited number of variations are possible, and an unlimited number of different technologies and/or components may be used in implementing the functionality of one embodiment.

Figure 3:
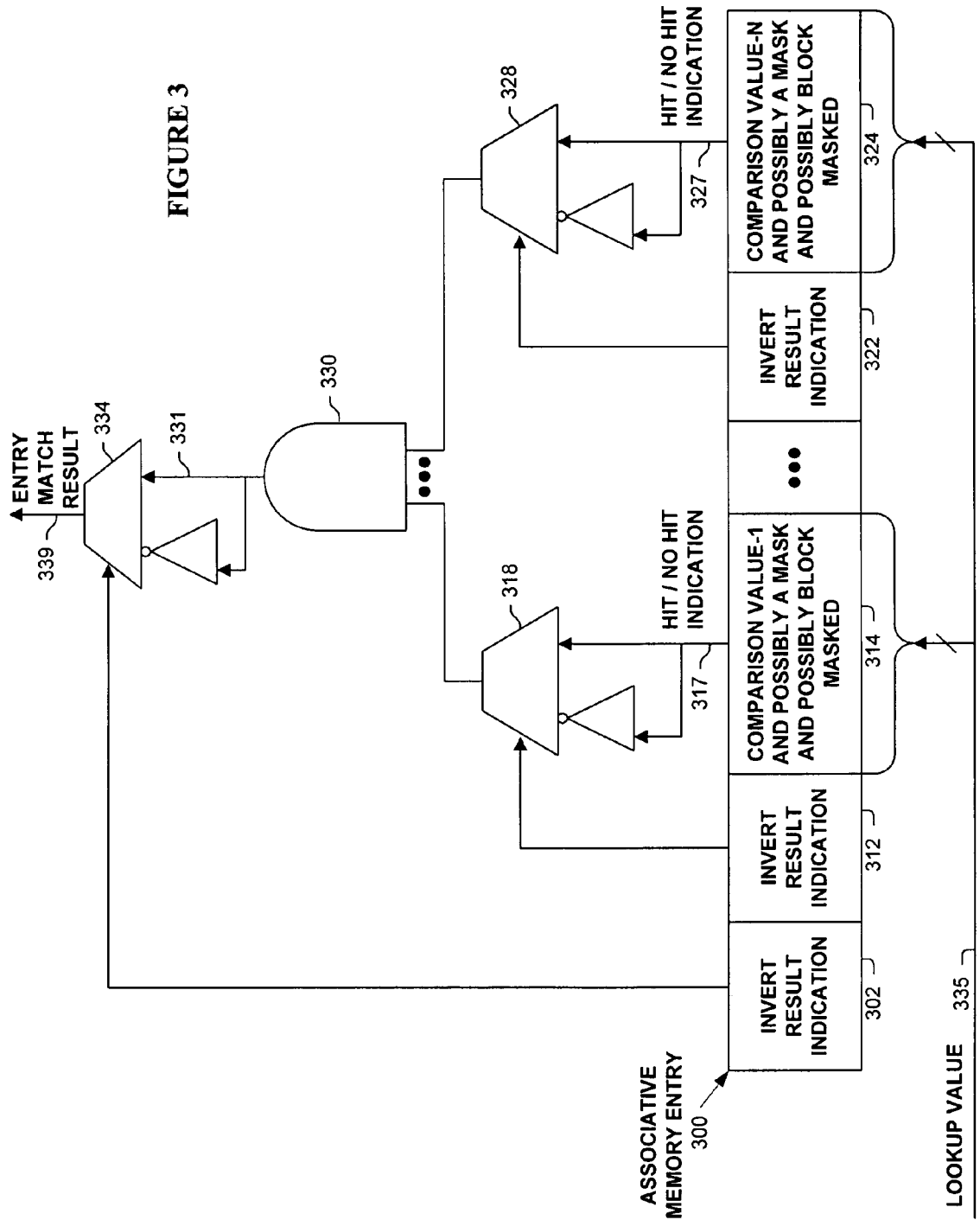
FIG. 3 is a block diagram of an associative memory entry with an invert result capability to allow the identification the entry or portion thereof as being matched when the entry is specifically not matched.

FIG. 3 is a block diagram of an associative memory entry 300 with an invert result capability to allow the identification the entry or portion (e.g., subset) thereof as being matched when the entry is specifically not matched (or alternatively viewed as an entry or portion thereof is indicated as not matched when it actually was matched). Thus, FIG. 3 expands that presented in FIG. 2 to illustrate that in one embodiment, one or more portions of a lookup value can be inverted while some portions may not. The boundaries of these subsets may be defined to match the needs of the application. In one embodiment, these boundaries are fixed, while in one embodiment, these boundaries are selectable. For example, for IPv4 applications, one embodiment provides the ability to selectively invert one or more of the four eight-bit subsets of the address, and one embodiment further includes the ability to selectively invert the entire final intermediate result. One embodiment includes the ability to selectively invert the matching result for each and every bit. An invert result indication to identify whether to invert an intermediate result for a subset of bits can be a value, a bitmap, an encoded value, or any other representation depending on the chosen implementation of the embodiment. If a bitmap is used, then typically one bit is required for each intermediate result which can be selectively inverted.

Shown in FIG. 3 is one embodiment that includes the traditional associative memory functionality including storing and/or generating comparison values 314 and 324 (which is possibly masked and/or block masked) which are compared against corresponding portions of lookup value 335 to generate a hit/no-hit (intermediate) indications 317 and 327 for associative memory entry 300. Note, in one embodiment, the aggregation of comparison values 314 and 324 (e.g., subsets of the full comparison value compared against lookup value 335) produce a comparison value used in a typically content-addressable memory. The mechanism or method used to store and generate a comparison values 314 and 324 and to compare them against corresponding portions of lookup value 335 to generate intermediate results 317 and 327 is extensible, and can be any known or future developed associative memory mechanism. Rather, one embodiment of the invention enhances this traditional capability by adding a mechanism to selectively invert results 317, 327, and 331 responsive to a stored invert result indications 302, 312, and 322 (e.g., one or more bits, a value, etc.) to produce entry match result 339. Typically and in one embodiment, the invert result indications are stored in the corresponding associative entry. In one embodiment, these invert result indications are stored elsewhere in or external to the associative memory.

One embodiment uses selection mechanisms 318 and 328, which are respectively responsive to invert result indications 312 and 322 to respectively select between the generated hit/no hit indications 317 and 327 or its inverted value (generated such as by the shown inverter) to produce intermediate matching results, which are then aggregated (e.g. by AND operation 330 or by some other logic or mechanism) to produce final intermediate result 331. One embodiment uses a selection mechanism 334 which is responsive to invert result indication 302 to select between the final intermediate result or its inverted value to produce the entry match result 339 indicating whether associative memory entry 300 is considered as a hit or a no-hit, with this signal typically being provided to a priority encoder or used directly by another mechanism or process. Of course, FIG. 3 illustrates the operation of one embodiment, and an unlimited number of variations are possible, and an unlimited number of different technologies and/or components may be used in implementing the functionality of one embodiment.

An example of the use of the functionality provided by one embodiment is in the processing of packets, such as performing operations responsive to access control list (ACL) entries. For example, an ACL entry might be "Deny NOT IP 10.1.1.1". Using the invert capability of one embodiment, a corresponding single associative entry can be generated which specifies to invert the match result of the lookup value and the address 10.1.1.1, with the resulting action being to drop the packet. (Typically, an indication of the corresponding action to take is stored in a memory adjunct to the associative memory at a position corresponding to the associative memory entry.) Thus, if the lookup value is 10.1.1.1, an intermediate match result of hit will be generated, which will be inverted (in response to a corresponding invert result indication) to a no-hit entry match result, and thus, the ACL entry will be skipped. If the lookup value contains a value other than 10.1.1.1, then an intermediate result of no-hit will be generated, and inverted to a hit entry match result, which will then cause the packet to be dropped.

Figure 4A:
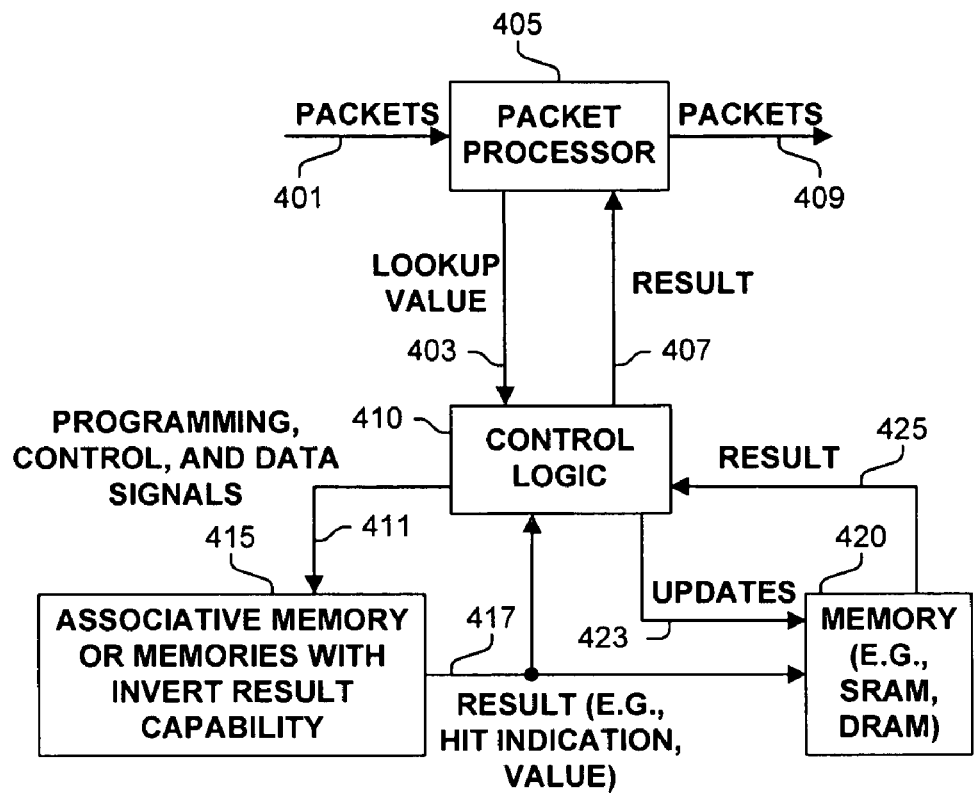
FIGS. 4A–C are block diagrams of various exemplary systems including one or more embodiments for programming and using an associative memory with an invert result capability to allow the identification of an entry as being matched when an entry or portion thereof is specifically not matched and/or for performing lookup operations on such programmed associative memories.
Figure 4B:
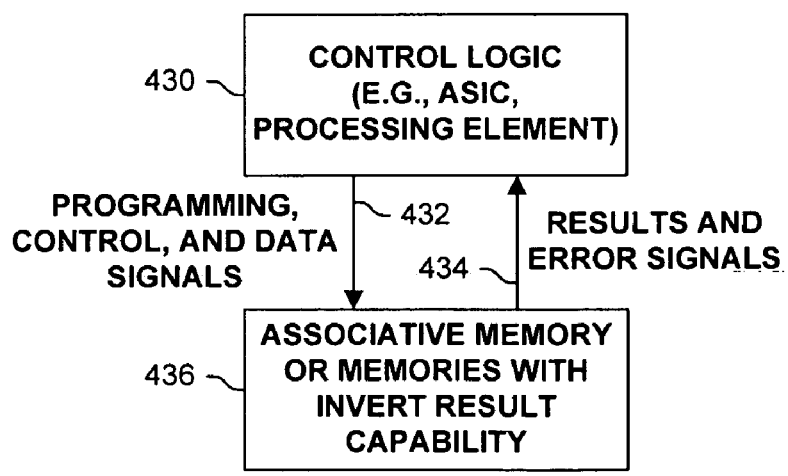
Figure 4C:
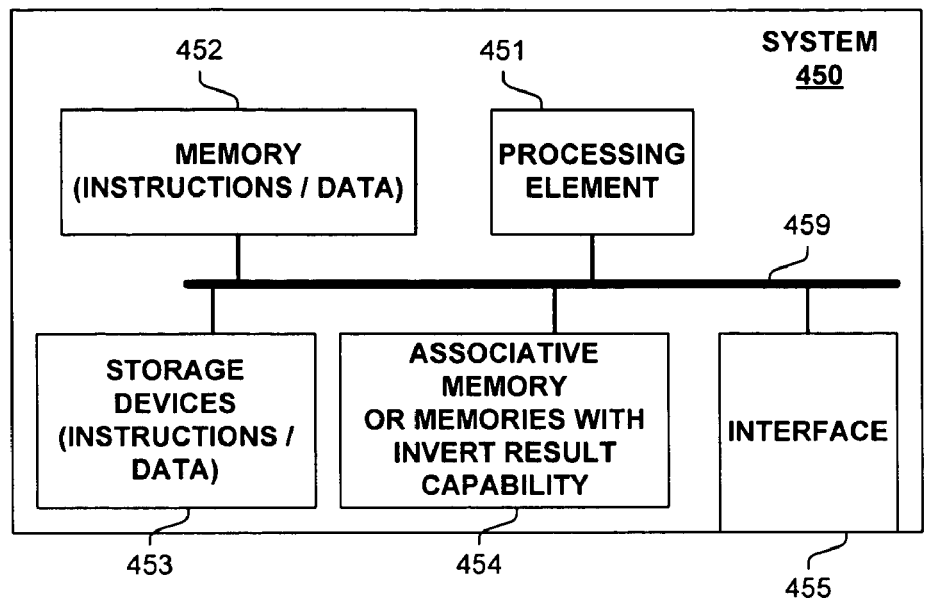

FIGS. 4A–C are block diagrams of various exemplary systems including one or more embodiments for programming and using an associative memory with an invert result capability to allow the identification of an entry as being matched when an entry or portion thereof is specifically not matched and/or for performing lookup operations on such programmed associative memories.

In one embodiment illustrated in FIG. 4A, control logic 410 programs and updates associative memory or memories 415 (having invert result capability and comparison values and invert result indications) via signals 411. In one embodiment, control logic 410 also programs memory 420 via signals 423. In one embodiment, control logic 410 includes custom circuitry, such as, but not limited to discrete circuitry, ASICs, memory devices, processors, etc.

In one embodiment, packets 401 are received by packet processor 405. In addition to other operations (e.g., packet routing, security, etc.), packet processor 405 typically generates one or more items, including, but not limited to one or more packet flow identifiers based on one or more fields of one or more of the received packets 401 and possibly from information stored in data structures or acquired from other sources. Packet processor 405 typically generates a lookup value 403 which is provided to control logic 410 for providing control and data information to associative memory or memories 415, which perform lookup operations and generate one or more results 417. In one embodiment, a result 417 is used is by memory 420 to produce a result 425. Control logic 410 then relays result 407, based on result 417 and/or result 425, to packet processor 405. In response, one or more of the received packets are manipulated and forwarded by packet processor 405 as indicated by packets 409.

FIG. 4B illustrates one embodiment of a system, which may be part of a router or other communications or computer system, for performing lookup operations on the one or more associative memories 436 (having invert result capability and comparison values and invert result indications). In one embodiment, control logic 430 determines the required ordering of block masks for multiple ACLs and, via signals 432, programs associative memory or memories 436. In addition, control logic 430 provides control and data information (e.g., comparison values, masks, invert result indications, lookup values, etc.) to associative memory or memories 436, which perform lookup operations to generate results and error signals 434, which are received by control logic 430.

FIG. 4C illustrates one embodiment of a system 450, which may be part of a router or other communications or computer system, for performing lookup operations on the one or more associative memories. In one embodiment, system or component 450 performs one or more processes corresponding to one of the diagrams illustrated herein or otherwise described herein.

In one embodiment, system 450 includes a processing element 451, memory 452, storage devices 453, one or more associative memories 454 (with invert result capability), and an interface 455 for connecting to other devices, which are coupled via one or more communications mechanisms 459 (shown as a bus for illustrative purposes). In one embodiment, processing element 451 determines associative memory entries for one or more ACLs and programs the one or more associative memories 454.

Various embodiments of system 450 may include more or less elements. The operation of system 450 is typically controlled by processing element 451 using memory 452 and storage devices 453 to perform one or more tasks or processes, such as programming and performing lookup operations using associative memory or memories 454. Memory 452 is one type of computer readable medium, and typically comprises random access memory (RAM), read only memory (ROM), flash memory, integrated circuits, and/or other memory components. Memory 452 typically stores computer executable instructions to be executed by processing element 451 and/or data which is manipulated by processing element 451 for implementing functionality in accordance with one embodiment of the invention. Storage devices 453 are another type of computer readable medium, and typically comprise solid state storage media, disk drives, diskettes, networked services, tape drives, and other storage devices. Storage devices 453 typically store computer executable instructions to be executed by processing element 451 and/or data which is manipulated by processing element 451 for implementing functionality in accordance with one embodiment of the invention.

In one embodiment, processing element 451 provides control and data information (e.g., comparison values, masks, invert result indications, lookup values, etc.) to associative memory or memories 454, which perform lookup operations to generate lookup results and possibly error indications, which are received and used by processing element 451 and/or communicated to other devices via interface 455.

Figure 5:
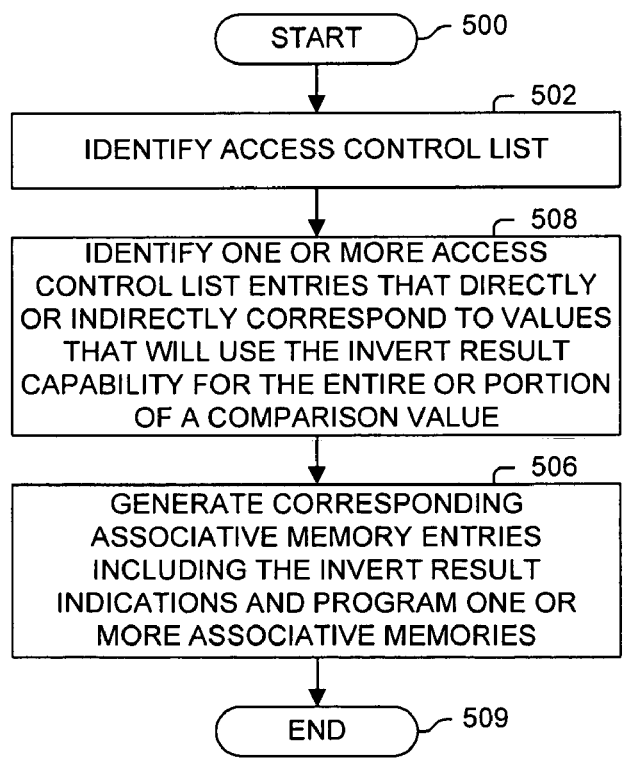
FIG. 5 illustrates a process used in one embodiment for identifying associative memory entries to be programmed.

FIG. 5 illustrates a process used in one embodiment for identifying associative memory entries to be programmed. Processing begins with process block 500, and proceeds to process block 502, wherein an access control list is identified. In process block 508, one or more access control list entries that directly (e.g., specify a NOT operation) or indirectly (e.g., generated based on an associative memory programming methodology) correspond to values that will use the invert result capability for the entire result and/or one or more subsets of the comparison value. In process block 506, the corresponding associative memory entries including the invert result indications are generated and programmed into one or more associative memories. Processing is complete as indicated by process block 509.

Figure 6:
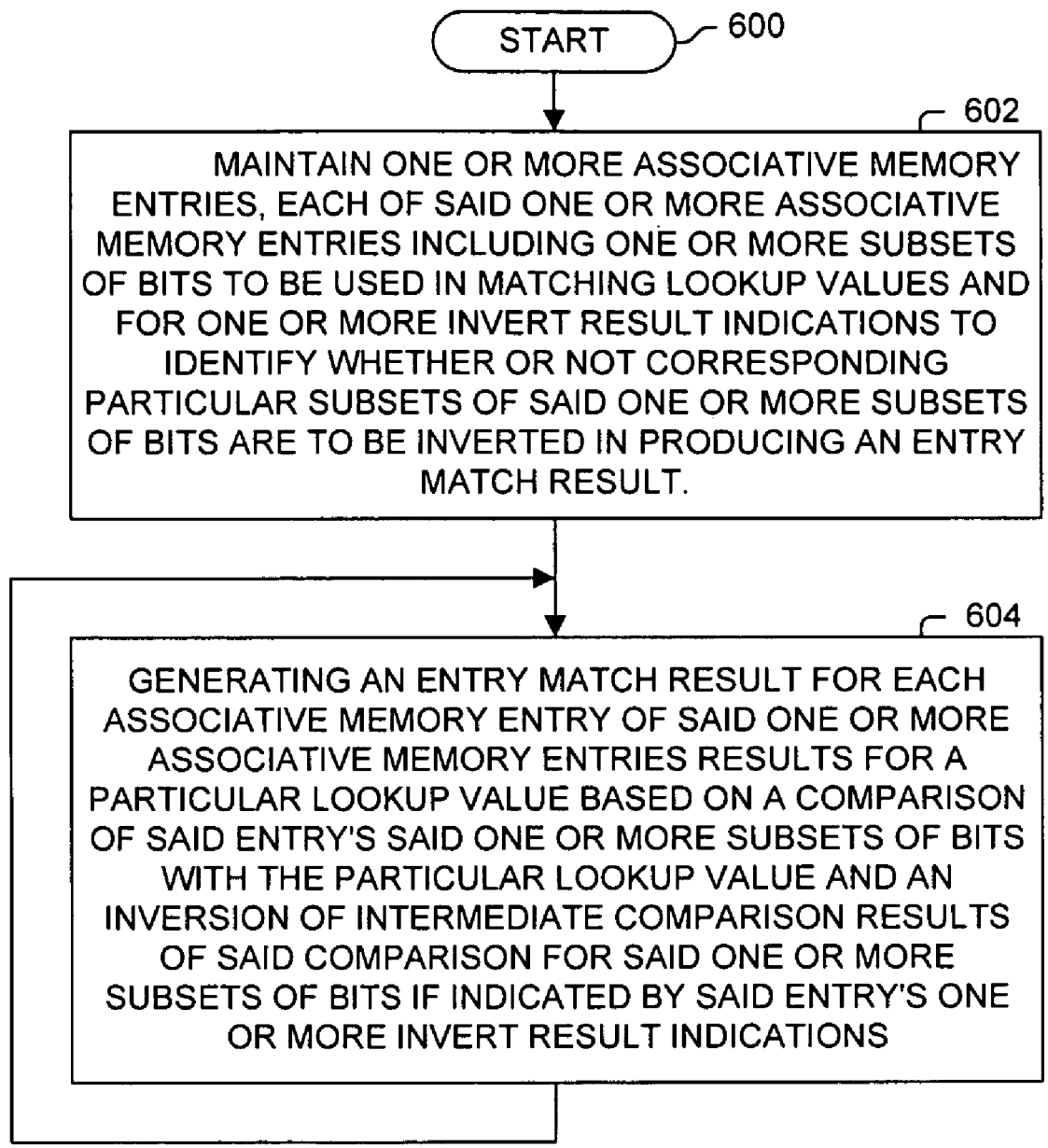
FIG. 6 illustrates a process used in one embodiment for using an associative memory with an invert result capability.

FIG. 6 illustrates a process used in one embodiment for using an associative memory with an invert result capability. Processing begins with process block 600, and proceeds to process block 602, wherein one or more associative memory entries are maintained, with each of the associative memory entries including one or more subsets of bits to be used in matching lookup values and for one or more invert result indications to identify whether or not corresponding particular subsets of the one or more subsets of bits are to be inverted in producing an entry match result. In process block 604, an entry match result is generated for each associative memory entry of the one or more associative memory entries for a particular lookup value based on a comparison of the entry's one or more subsets of bits with the particular lookup value and an inversion of intermediate comparison results of the comparison for the one or more subsets of bits if indicated by the entry's one or more invert result indications. Processing then returns to process block 604 to process another lookup value.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus for identifying matching values, the apparatus comprising:
a plurality of associative memory entries, each of the plurality of associative memory entries including:
storage for one or more subsets of bits to be used in matching a lookup value and for one or more invert result indications to identify whether or not corresponding particular subsets of said one or more subsets of bits are to be inverted in producing an entry match result; and
result generation logic to identifying the entry match result based on a comparison of said one or more subsets of bits with the lookup value and responsive to said one or more invert result indications to invert an intermediate comparison result for said one or more subsets of bits as indicated by said one or more invert result indications.

2. The apparatus of claim 1, wherein said one or more subsets of bits includes exactly one subset of bits.

3. The apparatus of claim 2, wherein said one subset of bits and the lookup value each include the same number of bits being compared against each other.

4. The apparatus of claim 1, comprising a priority encoder to identify a highest priority matching entry from said entry match results of the plurality of associative memory entries for a particular lookup value.

5. The apparatus of claim 1, wherein said one or more subsets of bits includes at least two subsets of bits.

6. A method for identifying matching values, the method comprising:
maintaining one or more associative memory entries, each of said one or more associative memory entries including one or more subsets of bits to be used in matching lookup values and for one or more invert result indications to identify whether or not corresponding particular subsets of said one or more subsets of bits are to be inverted in producing an entry match result; and
generating an entry match result for each associative memory entry of said one or more associative memory entries for a particular lookup value based on a comparison of said entry's said one or more subsets of bits with the particular lookup value and an inversion of intermediate comparison results of said comparison for said one or more subsets of bits if indicated by said entry's one or more invert result indications.

7. The method of claim 6, wherein said one or more subsets of bits includes exactly one subset of bits.

8. The method of claim 7, wherein said one subset of bits and the particular lookup value each include the same number of bits being compared against each other.

9. The method of claim 6, wherein said one or more associative memory entries includes at least two associative memory entries.

10. The method of claim 9, comprising identifying a highest priority matching entry from said entry match results of said one or more associative memory entries for the particular lookup value.

11. The method of claim 6, wherein said one or more subsets of bits includes at least two subsets of bits.

12. The method of claim 6, comprising identifying the values of said one or more invert result indications based on a specification of an access control list; and programming said one or more invert result indications with said identified values.

13. An apparatus for identifying matching values, the apparatus comprising:
means for maintaining one or more associative memory entries, each of said one or more associative memory entries including one or more subsets of bits to be used in matching lookup values and for one or more invert result indications to identify whether or not corresponding particular subsets of said one or more subsets of bits are to be inverted in producing an entry match result; and
means for generating an entry match result for each associative memory entry of said one or more associative memory entries results for a particular lookup value based on a comparison of said entry's said one or more subsets of bits with the particular lookup value and an inversion of intermediate comparison results of said comparison for said one or more subsets of bits if indicated by said entry's one or more invert result indications.

14. The apparatus of claim 13, wherein said one or more subsets of bits includes exactly one subset of bits.

15. The apparatus of claim 14, wherein said one subset of bits and the particular lookup value each include the same number of bits being compared against each other.

16. The apparatus of claim 13, wherein said one or more associative memory entries includes at least two associative memory entries.

17. The apparatus of claim 16, comprising means for identifying a highest priority matching entry from said entry match results of said one or more associative memory entries for the particular lookup value.

18. The apparatus of claim 13, wherein said one or more subsets of bits includes at least two subsets of bits.

19. The apparatus of claim 13, comprising means for identifying the values of said one or more invert result indications based on a specification of an access control list; and means for programming said one or more invert result indications with said identified values.

* * * * *

UNITED STATES PATENT AND TRADEMARK OFFICE
CERTIFICATE OF CORRECTION

PATENT NO.      : 7,219,195 B2                                    Page 1 of 1
APPLICATION NO. : 11/018993
DATED           : May 15, 2007
INVENTOR(S)     : Pullela et al.

It is certified that error appears in the above-identified patent and that said Letters Patent is hereby corrected as shown below:

Col. 12, line 32, claim 11 replace "more-" with -- more --

Signed and Sealed this

Sixth Day of November, 2007

JON W. DUDAS
*Director of the United States Patent and Trademark Office*